(12) United States Patent
Kolstad et al.

(10) Patent No.: US 9,781,862 B2
(45) Date of Patent: Oct. 3, 2017

(54) SUBSEA UNIT WITH CONDUCTION AND CONVECTION COOLING

(71) Applicant: ABB TECHNOLOGY LTD, Zürich (CH)

(72) Inventors: Helge Kolstad, Oslo (NO); Jan Wiik, Oslo (NO)

(73) Assignee: ABB SCHWEIZ AG, Zürich (CH)

( * ) Notice: Subject to any disclaimer, the term of this patent is extended or adjusted under 35 U.S.C. 154(b) by 88 days.

(21) Appl. No.: 14/891,267

(22) PCT Filed: May 15, 2014

(86) PCT No.: PCT/EP2014/059970
§ 371 (c)(1),
(2) Date: Nov. 13, 2015

(87) PCT Pub. No.: WO2014/184300
PCT Pub. Date: Nov. 20, 2014

(65) Prior Publication Data
US 2016/0088767 A1 Mar. 24, 2016

(30) Foreign Application Priority Data
May 16, 2013 (EP) .................................. 13167996

(51) Int. Cl.
*H05K 7/20* (2006.01)
*E21B 41/00* (2006.01)
*E21B 47/01* (2012.01)

(52) U.S. Cl.
CPC ..... *H05K 7/20245* (2013.01); *E21B 41/0007* (2013.01); *E21B 47/011* (2013.01); *H05K 7/2039* (2013.01); *H05K 7/20236* (2013.01); *H05K 7/20927* (2013.01)

(58) Field of Classification Search
CPC .......... H05K 7/20245; H05K 7/20236; H05K 7/2039; H05K 7/20927; E21B 41/0007; E21B 47/011
See application file for complete search history.

(56) References Cited

U.S. PATENT DOCUMENTS 4,908,757 A * 3/1990 Jensen ..................... H02K 9/22
310/54
6,520,745 B1 * 2/2003 Yamamoto .............. F04D 13/06
417/44.1

(Continued)

FOREIGN PATENT DOCUMENTS

EP 2 234 468 A1 9/2010
EP 2 467 005 A1 6/2012
(Continued)

*Primary Examiner* — David M Sinclair
*Assistant Examiner* — Robert Brown
(74) *Attorney, Agent, or Firm* — Birch, Stewart, Kolasch & Birch, LLP

(57) ABSTRACT

A subsea unit includes a housing containing a dielectric liquid, a first heat generating component and a second heat generating component. The first heat generating component is arranged in thermal connection with the housing and the second heat generating component is arranged at a distance from the housing. A method of cooling heat generating components contained in a housing of a subsea unit is also presented.

20 Claims, 4 Drawing Sheets

(56) References Cited

U.S. PATENT DOCUMENTS

| | | | | |
|---|---|---|---|---|
| 8,604,740 B2* | 12/2013 | D'Amico | ............... | H02K 5/132 166/250.13 |
| 2007/0279863 A1* | 12/2007 | Illerhaus | ................... | H02J 7/35 361/695 |
| 2008/0302115 A1* | 12/2008 | Eknes | .................... | H05K 5/068 62/183 |
| 2010/0254087 A1* | 10/2010 | Godfroy | ................. | H05K 5/06 361/699 |
| 2010/0290190 A1* | 11/2010 | Chester | ............. | H05K 7/20772 361/701 |
| 2011/0017454 A1* | 1/2011 | Sanderlin | ............. | E21B 47/011 166/302 |
| 2012/0155028 A1* | 6/2012 | Stokes | ............... | H05K 7/20463 361/699 |
| 2013/0015376 A1* | 1/2013 | Kocurek | ............... | F16K 31/002 251/11 |
| 2013/0265713 A1* | 10/2013 | Crane | ....................... | G06F 1/20 361/679.51 |
| 2015/0181769 A1* | 6/2015 | Oki | ................... | H05K 7/20745 165/121 |
| 2015/0216080 A1* | 7/2015 | Chan | ................. | H05K 7/20236 361/700 |
| 2016/0330865 A1* | 11/2016 | Mathew | ............. | H05K 7/20236 |

FOREIGN PATENT DOCUMENTS

| | | | |
|---|---|---|---|
| EP | 2 487 327 A1 | 8/2012 | |
| GB | 2 199 203 A | 6/1988 | |

\* cited by examiner

SUBSEA UNIT WITH CONDUCTION AND CONVECTION COOLING

TECHNICAL FIELD

The present disclosure generally pertains to subsea installations and in particular to a subsea unit comprising heat generating components which are to be cooled.

BACKGROUND

In recent years, there has been a growing interest in electrical installations on the seabed in depths from a few tens of meters to even kilometers. In bringing power electronics subsea, two general concepts exist: (1) the equipment stays at atmospheric pressure; and (2) the equipment is pressurized to the hydrostatic pressure level on sea ground. The two concepts can be differentiated as follows. Concept (1) has the advantage that standard electric/electronic components, known from onshore installations, can be used, while disadvantages include thick walls needed for the enclosure to withstand the pressure difference between inside and outside. Thick walls make the equipment heavy and costly and prevent efficient cooling of the internal electric and electronic devices and set high requirements on seals and penetrators. Concept (2) has the advantage that no thick walls are needed for the enclosure since no or only a relatively small pressure difference exists between inside and outside the containment.

EP2487327 A1 discloses a subsea electronic system in which an enclosure contains a dielectric liquid and a heat generating component. In operation, heat is transferred from the heat generating electronic component to the water surrounding the enclosure via the dielectric liquid.

SUMMARY

A general object of the present disclosure is to provide a subsea unit that ensures efficient and optimized cooling of heat generating components in a passive way.

According to the present invention, this object is solved by a subsea unit comprising a housing containing a dielectric liquid, a first heat generating component and a second heat generating component. Importantly, the first heat generating component is arranged in thermal conductive connection with the housing and the second heat generating component is arranged at a distance from the housing.

Since the first component is in thermal conductive connection with the housing, it can be cooled very efficiently. During operation, the heat generated in the first component can be conducted through the housing to the surrounding sea water. A portion of said heat heats the dielectric liquid within the housing and thereby creates a convective flow, which cools the second component.

More in detail, the dielectric liquid within the housing will be heated by the first component and will thus be stimulated to move upwards in the area of the first component. Apart from where the hot first component is conductively connected to the housing, the dielectric liquid within the housing will be cooled by the surrounding sea water through the housing. Thus, the dielectric liquid within the housing, apart from where the hot first component is conductively connected to the housing, will be stimulated to move downward within the housing. The temperature difference between the hot first component and the cool housing generates a convective flow.

Accordingly, the cooling provided by the subsea unit is optimized in that the first component is very efficiently cooled by both conduction and convection, whereas the second component is cooled by convection only. The first component is cooled by heat dissipation to the sea water via conduction, and cooled by heat dissipation to the dielectric liquid via convection. The second component is cooled by heat dissipation to the dielectric liquid via convection.

Preferably, the first component is arranged in thermal conductive connection with a side wall of the housing. Thereby, the convective flow of the dielectric liquid within the housing is enhanced.

The first component may be arranged in thermal conductive connection with the housing by arranging the component directly on the housing, more precisely on an inner wall of the housing. The first component may be attached to an inner wall of the housing. The first component may be welded to an inner wall of the housing, or be attached by screws, snap-fit connection or adhesive.

The dielectric liquid preferably fills the housing at least to a level such that the heat generating components are immersed in the dielectric liquid. With dielectric liquid surrounding the components, heat generated therein can be efficiently absorbed by the dielectric liquid. The dielectric liquid may fill the housing completely, which may have a positive effect on the convective flow.

The first component may be a component having high heat loss during operation, such as a semiconductor, a resistor or a motor. Due to the thermal conductive connection to the housing, and thus to the surrounding sea water, the heat is efficiently transferred to the sea water. Also, the high heat loss is beneficial when it comes to generating the convective flow of the dielectric liquid.

The second component may be a component having lower heat loss than the first component. The second component can for example be a capacitor that requires less cooling, so that the convection cooling provided by the convective flow of the dielectric liquid is sufficient.

In order to further improve the heat transfer from the first heat generating component to the dielectric liquid, a first heat sink may be arranged in thermal conductive connection with the first component.

By arranging the first heat sink in thermal conductive connection with the housing, the heat sink may be efficiently cooled by heat conduction to the housing and therethrough to the surrounding sea water.

The first component may be arranged in thermal conductive connection with the housing by arranging the component on a first heat sink which is arranged directly on the housing, more precisely on an inner wall of the housing. The first heat sink may be attached to an inner wall of the housing. The first heat sink may be welded to an inner wall of the housing, or be attached by screws, snap-fit connection or adhesive.

Said first heat sink may be arranged on the housing, and the first component may in turn be arranged on the first heat sink. The first heat sink may support the first component. The first component may be attached to the first heat sink. The first component may be welded to the first heat sink, or be attached by screws, snap-fit connection or adhesive. The heat generated in the first component will then be conducted to and through the heat sink and the housing wall, to the sea water. This means that a lot of heat will be transferred through the heat sink, whereby the heat sink may give rise to a powerful convective flow of the dielectric liquid.

Alternatively, the first component may be arranged on the housing, and the first heat sink may be arranged on the first component. The first component may support the first heat sink. The heat generated in the first component will then be conducted directly to and through the housing wall to the sea water. The heat generated in the first component will also be conducted directly to the first heat sink. Consequently, the first component will be efficiently cooled by conduction to both the housing and to the first heat sink.

Also, the first heat sink and the first component may both be arranged on the housing, side by side. The heat generated in the first component may be conducted to the first heat sink via the housing or directly to the first heat sink if the first component is attached to the first heat sink.

The first heat sink is preferably designed to efficiently heat the dielectric liquid. The first heat sink preferably comprises large heat transfer surfaces in contact with the dielectric liquid. The first heat sink may comprise through holes or a number of longitudinal fins so that the dielectric liquid may pass through the first heat sink.

In order to control the convective flow of the dielectric liquid within the housing, a first flow directing structure may be arranged along a sidewall of the housing for guiding the dielectric liquid vertically. The first flow directing structure may extend along at least 50% of the sidewall height, preferably along 60-90% thereof. The first flow directing structure may extend along the entire sidewall width.

The first heat generating component and/or the first heat sink may be arranged between said sidewall and the first flow directing structure, thus efficiently heating the dielectric liquid present between said sidewall and the first flow directing structure.

A particularly powerful convective flow of the dielectric liquid may be obtained by arranging the first heat sink between the sidewall and the first flow directing structure and arranging the first heat generating component on the inner side of the first flow directing structure.

In order to further control the convective flow of the dielectric liquid within the housing, a second flow directing structure may be arranged along a top wall of the housing for guiding the dielectric liquid horizontally. The second flow directing structure may extend along 40-90% of the top wall height.

Yet improved control of the convective flow of the dielectric liquid within the housing can be achieved by arranging the first flow directing structure connected to the second flow directing structure, so that the dielectric liquid is first guided vertically and subsequently guided horizontally.

The first and second flow directing structures, each one alone but especially in combination, particularly when connected, may contribute to an essentially circular convective flow of the dielectric liquid in the housing. In this connection, the flow directing structures may preferably extend along at least half the length of the respective housing walls. A circular convective flow brings the advantage that the dielectric liquid flow is distributed over the inner volume of the housing. By ensuring that the dielectric liquid is guided along the housing walls, the dielectric liquid is efficiently cooled by the housing.

A second heat sink may be arranged in thermal conductive connection with the top wall of the housing. Thereby, the dielectric liquid, which has been heated by the first component, can be efficiently cooled. Like the first heat sink, the second heat sink is preferably designed for efficient heat transfer between the dielectric liquid and the heat sink.

The first heat sink may be elongated and aligned vertically. The second heat sink may be elongated and aligned horizontally.

A flow restriction arrangement may be provided for preventing dielectric liquid guided by the second flow directing structure from mixing with dielectric liquid guided by the first flow directing structure, for example, a part of the second flow directing structure may be inclined downwards in a direction away from the first flow directing structure. This means that dielectric liquid that is guided by the second flow directing structure, which is being cooled by the top wall of the housing, will flow down the inclination and away from the first flow directing structure.

Alternatively, a flow restriction arrangement may be provided as a threshold or a check valve arranged in the area where the first and second flow directing structure are connected. The flow restriction arrangement may improve the convective flow of the dielectric liquid. Especially, the flow restriction arrangement may shorten the time needed for generation of a convective flow during start-up of the subsea unit.

The first heat generating component may be arranged in thermal conductive connection with a side wall of the housing. As has been explained, the heat generated by the first heat generating component will create a conductive flow, which flow will move upwards along said side wall. Since the side wall is cooled by the surrounding sea water, the side wall, apart from where the first heat generating component is located, will act to cool the dielectric liquid and thereby counteract the flow. Arranging a side wall insulator insulating said side wall may have a positive effect on the convective flow. Such a side wall insulator shall be arranged to insulate the side wall apart from where the first heat generating component is located.

The subsea unit is preferably pressure compensated, which means that the pressure inside the housing essentially equals the pressure outside the housing. Pressure compensation can be achieved by forming a major part of the housing of a relatively thin sheet metal, for example around 10 mm, and filling the housing entirely with the dielectric liquid. In this way, a major part of the housing will acts as a pressure compensator. Alternatively, or in addition, pressure compensating means may be used. Such pressure compensating means may for example be a portion of the housing wall made of flexible material. Another option is connecting the housing to a separate pressure compensator comprising a flexible membrane separating the dielectric liquid and the sea water.

A subsea unit can be arranged within another subsea unit. Also, a plurality of subsea units can be arranged within one single subsea unit. Put in other words, a subsea unit arrangement may comprise a main subsea unit, configured as described above, having a subordinate subsea unit, also configured as described above, arranged inside said main subsea unit.

The subsea unit may be part of a subsea power system such as a power transmission system or a power distribution system.

According to the invention, the object is also solved by a method of cooling heat generating components contained in a housing of a subsea unit comprising the steps: providing a housing, arranging a first heat generating component in thermal conductive connection with the housing, arranging a second heat generating component at a distance from the housing, filling the housing with a dielectric liquid so that the heat generating components are immersed in the dielectric liquid, arranging the subsea unit under the sea water surface, preferably on the seabed, so that the housing is cooled by the sea water and supplying electric power to the heat generating components so that the first heat generating component heats up the dielectric liquid and thus a convective flow of the dielectric liquid is created within the housing, cooling also the second heat generating component.

BRIEF DESCRIPTION OF THE DRAWINGS

Specific embodiments of the invention will now be described, by way of example, with reference to the accompanying drawings, in which.

DETAILED DESCRIPTION

Figure 1:
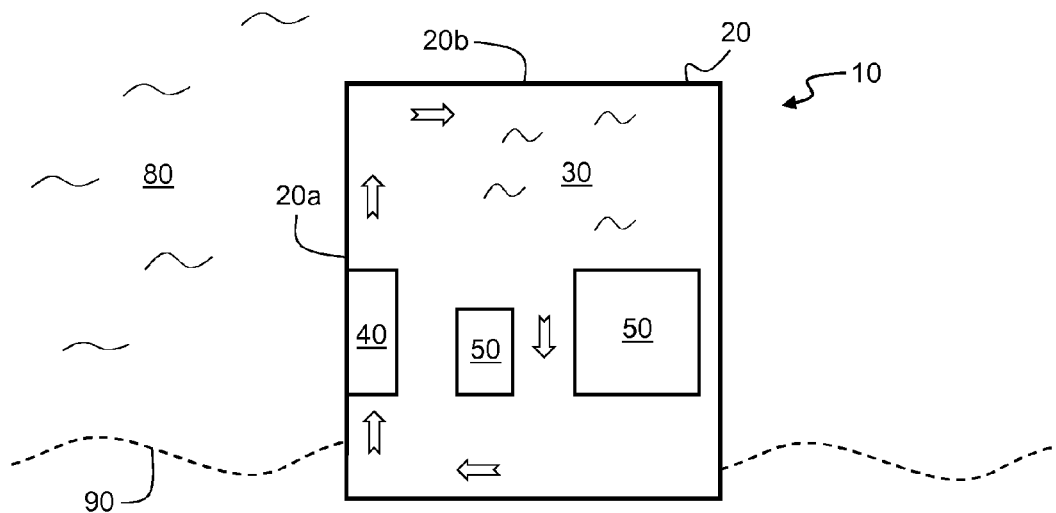
FIGS. 1 and 3-6 are schematic side views of embodiments of subsea to units.

A first embodiment of the present invention is shown in FIG. 1, which discloses a subsea unit to comprising a housing 20 filled with a dielectric liquid 30. Examples of suitable dielectric liquids are transformer oil, ester and purified water. Heat generating components 40, 50 are arranged inside the housing 20. The subsea unit to is surrounded by sea water 80 and rests on the seabed 90.

None of the schematic figures of the present disclosure include wiring that connect the components to each other, or that connect the subsea unit to oil & gas equipment or onshore power supply. Also not shown are penetrators for such wirings, a foundation or support structures for the subsea unit.

The first heat generating component 40, hereafter termed first component 40, is attached to the left hand sidewall 20a of the housing. The first component 40 is arranged in thermal conductive connection with the housing 20. This means that when the first component 40 generates heat during operation, a major portion of that heat is conducted to the cold surrounding sea water 80. Especially if the housing 20 is made of relatively thin and heat conductive metal, e.g. to mm steel or aluminium, the heat conduction to the sea water 80 will effectively cool the first component 40.

In addition to the cooling via heat conduction to the sea water, the first component 40 will be cooled by the dielectric liquid 30 that surrounds it. As the first component 40 heats the dielectric liquid 30, the dielectric liquid is stimulated to move upwards. Since the rest of the housing 20, i.e. apart from where the first component 40 is located, is relatively cold due to the contact with the sea water 80, the dielectric liquid 30 will be cooled and a natural convective flow will be generated. The first component 40 functions as a pump driving the flow of dielectric liquid 30. This flow is illustrated by the arrows within the housing 20 in FIG. 1. The convective flow of the dielectric liquid 30 passes the second heat generating components 50 and ensures cooling thereof.

In the examples shown here, the first component 40 is located around the middle of the vertical height of the sidewall 20a, more precisely; the first component 40 is located just below the vertical centre of the sidewall 20a.

Figure 2:
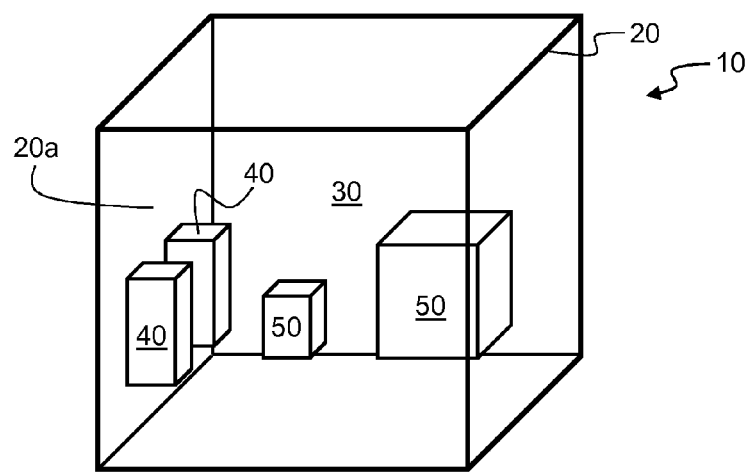
FIG. 2 is a schematic perspective view of the embodiment in FIG. 1.

FIG. 2 illustrates the same subsea unit 10 in perspective. As can be seen, there are two first components 40 mounted next to each other on the sidewall 20a. There may be one or more first component(s) 40. When two or more first components 40 are arranged on the sidewall 20a, these should preferably be positioned at a distance from each other so that the convective flow of the dielectric liquid 30 is encouraged by the dielectric liquid 30 being able to flow upwards at three sides around each component 40.

The second heat generating components 50, hereafter termed second components 50, are arranged inside the housing 20 at a distance from any wall of the housing 20. Thus, the second components 50 are not in thermal conductive connection with the housing 20. This means that the dielectric liquid 30 can flow freely around the second components 50.

Figure 3:
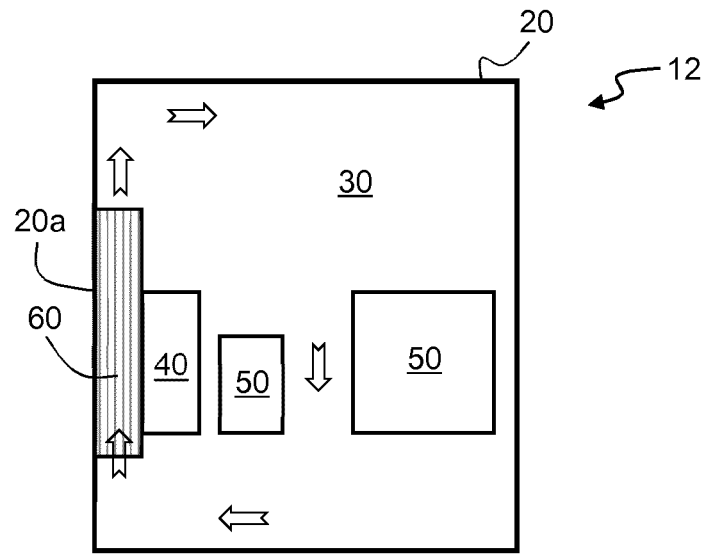

A subsea unit 12 according to a second embodiment is shown in FIG. 3. This embodiment differs from the one described above in that a first heat sink 60 has been arranged on the left hand sidewall 20a and carries the first component 40. As is illustrated by the longitudinal stripes and the arrow pointing into the first heat sink 60, the heat sink comprises through holes or a number of longitudinal fins extending side by side so that the dielectric liquid 30 may flow through the heat sink 60 and efficiently absorb heat.

Again, the first component 40 is arranged in thermal conductive connection with the housing 20. Since the conductive connection is established via the first heat sink 60, a larger portion of the heat generated in the first component 40 can be transferred to the dielectric liquid 30 and a powerful convective flow may be generated.

As an alternative which is not shown, at least one first component 40 and at least one first heat sink 60 may be arranged next to each other on the first sidewall 20a. For instance, a first heat sink 60 may be arranged between the two first components in FIG. 2. Both the first component 40 and the first heat sink 60 may be attached to the sidewall 20a. Alternatively, the first component 40 may be attached to the sidewall 20a and the first heat sink 60 may be attached to the first component 40, or vice versa.

Figure 4:
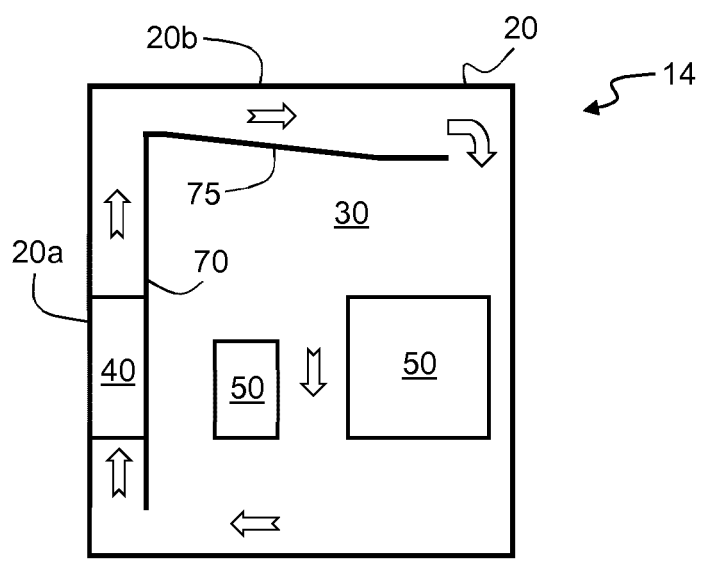

Turning now to FIG. 4, a subsea unit 14 according to a third embodiment is illustrated. As compared to the first embodiment, first and second flow directing structures 70, 75 have been introduced. The embodiment will to begin with be described without the second flow directing structure 75, which is not necessary for the function of the third (or fourth) embodiment.

The first flow directing structure 70 extends vertically along the sidewall 20a on which the first component is mounted. An inlet for the dielectric liquid 30 is formed at the lower end of the first flow directing structure 70, and an outlet for the dielectric liquid 30 is formed at the upper end of the first flow directing structure 70. Between said inlet and outlet, a vertical channel for the dielectric liquid 30 is formed.

In the illustrated example, the first flow directing structure 70 extends along approximately 80% of the sidewall 20a height, i.e. the height of the first flow directing structure 70 corresponds to 80% of the inner height of the housing 20. The first flow directing structure 70 is a plate which is arranged in parallel with the first sidewall 20a. With reference to the perspective view of FIG. 2, the first flow directing structure 70 may extend from the front sidewall to the rear sidewall of the housing 20. Thus, the first flow directing structure 70 may extend along the entire sidewall 20a width.

The first component 40 is arranged between the sidewall 20a and the first flow directing structure 70, which means that the first component is located within the vertical channel. A powerful vertical convective flow of the dielectric liquid 30 can thus be achieved.

Adding now the second flow directing structure 75, which extends essentially horizontally along the top wall 20b of the housing 20, an improved cooling of the dielectric liquid 30 can be obtained. The second flow directing structure 75 acts to prolong the dielectric fluid flow contact with the cool top wall 20b of the housing 20. As can be seen in FIG. 4, the second flow directing structure 75 extends along approximately 80% of the top wall 20b width.

Just like the first flow directing structure 70, the second flow directing structure 75 is a plate and it may extend from the front sidewall to the rear sidewall of the housing 20. The second flow directing structure 75 forms a floor of a horizontal channel for the dielectric liquid.

Figure 5:
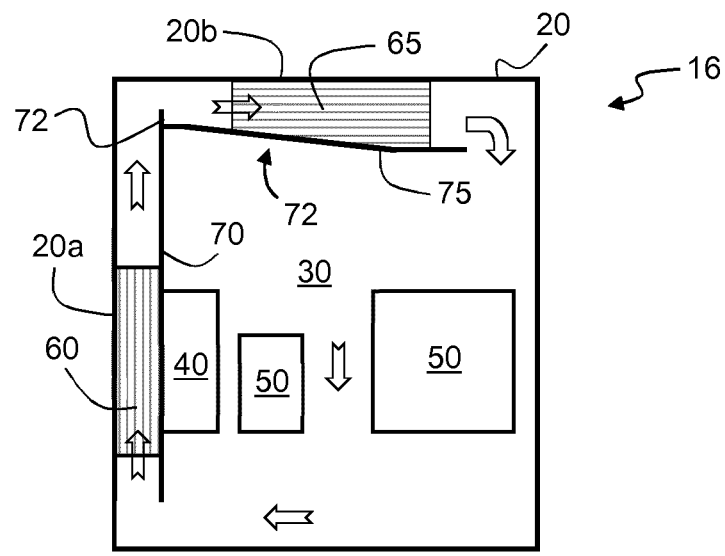

As is shown, the second flow directing structure 75 is inclined downwards in the centre thereof. Thereby, a flow restriction arrangement 72 is formed, which hinders the dielectric liquid 30 from flowing "backwards" down into the vertical channel. In addition, or as an alternative, such a flow restriction arrangement 72 may consist of a threshold as shown in FIG. 5. Said threshold 72 is formed by the first flow directing structure 70 extending vertically to a position higher that the second flow directing structure 75. In this way, the dielectric liquid 30 rising through the vertical channel has to reach a level high enough to pass over the upper edge 72 of the first flow directing structure 70 before coming into contact with and being able to flow horizontally along the second flow directing structure 75. As an alternative (not shown), a check valve may be arranged in the area where the first and second flow directing structures 70, 75 meet.

FIG. 5 discloses a subsea unit 16 according to a fourth embodiment. This embodiment corresponds to the third embodiment, but with the addition of heat sinks 60, 65 arranged on the outer side of the flow directing structures 70, 75. Another difference is that the first component 40 is attached to the inner side of the first flow directing structure 70, and is thus not located within the vertical channel. Lastly, the flow restriction arrangement in form of a threshold 72 as described above is illustrated.

The advantage of placing the first component 40 in conducting contact with the sidewall 20a via the first heat sink 60 has already been described in connection with the second embodiment shown in FIG. 3. Now, the first flow directing structure 70 extending vertically between the first component 40 and the first heat sink 60, as shown in FIG. 5, may further enhance the flow within the vertical channel. Since the first component 40 is not located within the channel, it will not obstruct the flow. However, as an alternative version (not shown) of the fourth embodiment, as described above with reference to FIG. 2, at least one first component 40 and at least one first heat sink 60 can be arranged next to each other on the first sidewall 20a within the vertical channel.

A second heat sink 65 is arranged in conducting contact with the top wall 20b. In FIG. 5, the second heat sink 65 extends from the second flow directing structure 75 to the top wall 65, even though a second heat sink of lesser height is also conceivable, which would allow the dielectric liquid 30 to flow freely below such a heat sink, i.e. between the lower edge of the heat sink 65 and the second flow directing structure 75. In accordance with the fourth embodiment, the second heat sink 65 has a trapezoidal shape which encourages the dielectric liquid 30 to flow out of the heat sink 65.

In operation, the first heat sink 60 acts to heat the dielectric liquid 30, whereas the second heat sink 65 acts as to cool the dielectric liquid 30. Both heat sinks 60, 65 have an amplifying effect on the convective flow of the dielectric liquid 30. Ideally, the temperature of the dielectric liquid 30 leaving the horizontal channel is essentially the same as the temperature of the dielectric liquid 30 entering the vertical channel. The first component 40 and the first and second heat sinks 60, 65 together with the first and second flow directing structures 70, 75 then function as a pump driving the flow of dielectric liquid 30.

Figure 6:
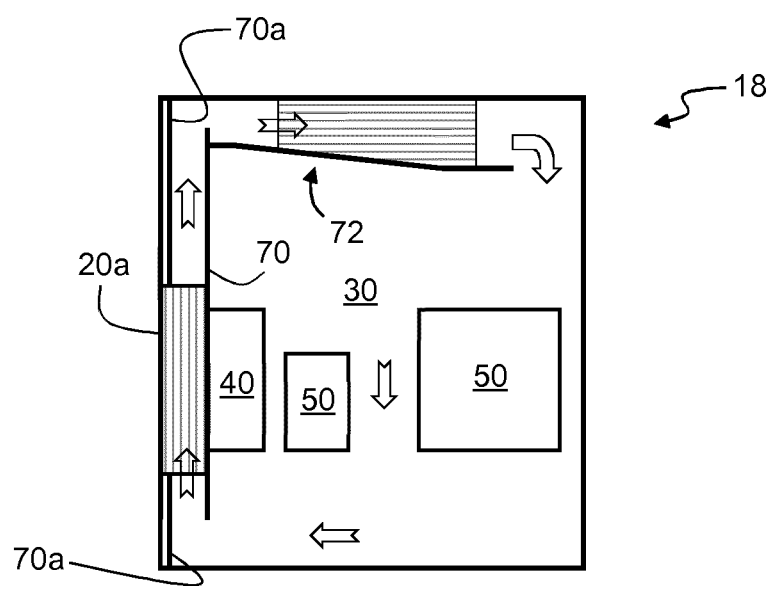

FIG. 6 discloses a subsea unit 18 according to a fifth embodiment. This embodiment is identical to the fourth embodiment 16, but with the addition of a side wall insulator 70a.

As has been explained, the dielectric liquid 30 is stimulated to move upwards by the heat generated in the first component 40. Now, in all embodiments disclosed, this movement of the dielectric liquid 30 is counteracted by the fact that the side wall 20a, apart from where the first component 40 is located, is colder than the dielectric liquid 30. By means of the side wall insulator 70a, the flow of the dielectric liquid 30 will not be negatively influenced by the cold side wall 20a. Even though the side wall insulator 70a is only shown in FIG. 6, it may be included in all embodiments described.

In FIG. 6, the side wall insulator 70a is a plate which is arranged in parallel with the first side wall 20a. The first side wall 20a may be a double wall, of which the side wall insulator 70a forms the inner wall. Alternatively, the side wall insulator 70a may be an insulating material attached to the inner side of the first side wall 20a. The side wall insulator 70a preferably covers the entire first side wall 20a, apart from where the first component 40, and/or the first heat sink 60, is located.

Figure 7:
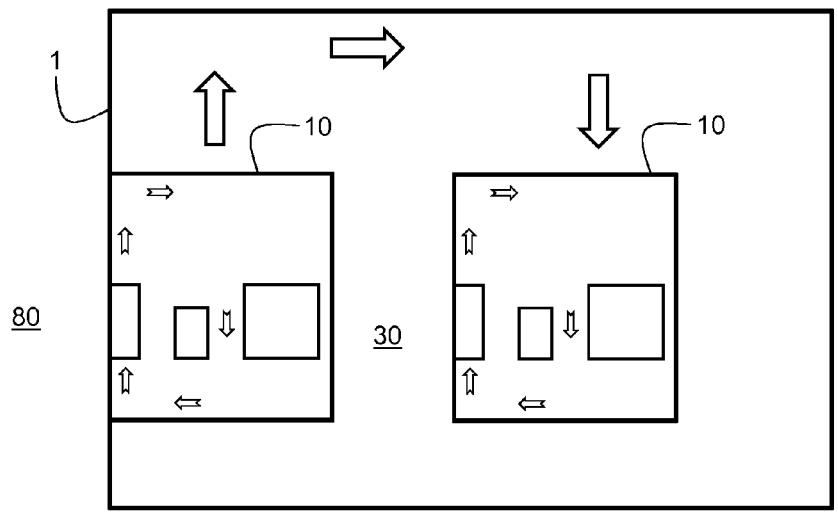
FIG. 7 is a schematic side view explaining how one subsea unit can be arranged within another subsea unit, and FIG. 8 schematically illustrates a method of cooling heat generating components contained in a housing of a subsea unit.

Any one of the subsea units 10, 12, 14, 16, 18 described may be arranged within another subsea unit. An example is illustrated in FIG. 7. Here, two subsea units 10 in accordance with the first embodiment are enclosed as subordinate subsea units 10 within a main subsea unit 1. The main subsea unit 1 contains a dielectric liquid in which the subordinate subsea units 10 are immersed.

In FIG. 7, the leftmost subordinate subsea unit to is arranged in thermal conductive connection with the housing of the main subsea unit 1. Thus, the left-most subordinate subsea unit to corresponds to a first component 40. The rightmost subordinate subsea unit 10 is arranged at a distance from the housing of the main subsea unit 1 and corresponds to a second component 50.

As an alternative, both subordinate subsea units to may be arranged at a distance from the housing of the main subsea unit 1, which means that all heat generated in the subordinate subsea units 10 will be transferred via the dielectric liquid 30 within the main subsea unit 1 to the sea water 80 that surrounds the main subsea unit 1.

Figure 8:
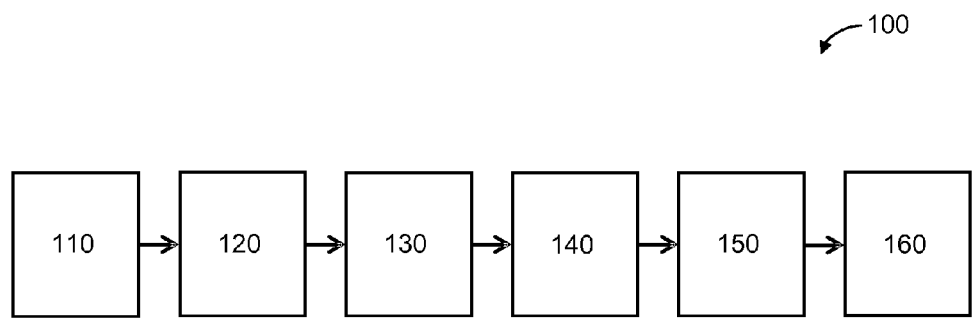

FIG. 8 schematically illustrates steps 110-160 of a method 100 of cooling heat generating components 40, 50 contained in a housing 20 of a subsea unit to, 12, 14, 16, 18.

In a first step 110, a housing 20 is provided. The housing 20 is water tight and preferably relatively thin such that heat can be conducted through the housing wall.

Next 120, a first component 40 is arranged within the housing 20 in thermal conductive connection with the housing 20. The first component 40 may for instance be attached to the housing 20, preferably to a side wall 20a of the housing. A heat sink 60 may be provided for increased heat transfer capacity. The heat sink 60 and the first component 40 may both be attached to the side wall 20a, or one may be attached first to carry the other.

A third step 130 includes arranging a second component 50 within the housing 20 at a distance from the housing 20. This step 130 may include arranging support means that hold the second component 50 in place within the housing 20. The second 120 and third 130 steps may be performed in any order.

Although not described in detail, before the next step the components 40, 50 are connected to each other by wiring and penetrators are put in place and sealed.

In a fourth step 140 the housing 20 is filled with a dielectric liquid 30 so that the heat generating components 40, 50 are immersed in the dielectric liquid 30. Also the housing 20 is sealed.

Subsequently, in step five 150, the subsea unit is lowered under the sea 80, and preferably installed on the seabed 90, where the housing 20 is cooled by the sea water 80.

Finally, in step six 160, electric power is supplied to the heat generating components 40, 50 so that the first component 40 heats up the dielectric liquid 30 and thus a convective flow of the dielectric liquid 30 is created within the housing 20. Now, cooling of the first component is obtained both by conduction through the housing 20 wall and by convection to the dielectric liquid 30. The second component 50 is cooled by convection to the dielectric liquid 30.

The above embodiments to, 12, 14, 16, 18 form examples of realizations of the present invention within the scope of the appended independent claims. A number of variations are possible without departing the claimed scope. First of all, one or more first components 40 and/or first heat sinks 60 may be arranged on more than one sidewall, e.g. on two sidewalls or even on all side-walls. The same applies to the first flow directing structures. However, if second flow directing structures 75 are arranged opposite each other, they should each extend along less than 50% of the top wall 20b, e.g. along 20-30% of the top wall. Also, provided that heat transfer through thick walls is ensured, the inventive concept can be applied on subsea units with pressure resistant housings. Heat transfer through thick walls can be obtained by heat sinks or heat exchangers extending through the walls. The housing 20 may be parallelepipedic or cylindrical (not shown). Preferably, the housing is a closed body whose top and bottom walls are continuous and cover the entire top and bottom areas of the housing. Thus, the housing does not comprise any passages or lead-throughs for the surrounding sea water. Passages or lead-throughs would be susceptible to blocking by sea life, sea growth or debris.

The invention claimed is:

1. A subsea unit comprising: a housing containing a dielectric liquid;
   a first heat generating component; and
   a second heat generating component, wherein the first heat generating component is arranged in thermal conductive connection with the housing,
   wherein the second heat generating component is arranged at a distance from a lateral side wall of the housing,
   wherein the first heat generating component is arranged in thermal conductive connection with the lateral side wall of the housing.

2. The subsea unit of claim 1, wherein said subsea unit is a pressure compensated subsea unit, the housing being entirely filled with the dielectric liquid.

3. The subsea unit of claim 1, wherein the first heat generating component has a higher heat loss than the second heat generating component.

4. The subsea unit of claim 1, further comprising a first heat sink arranged in thermal conductive connection with the first heat generating component.

5. The subsea unit of claim 4, wherein the first heat sink is arranged in thermal conductive connection with the housing.

6. The subsea unit of claim 1, further comprising a first flow directing structure arranged along the sidewall of the housing for guiding the dielectric liquid vertically.

7. The subsea unit of claim 6, wherein the first heat generating component is arranged between the sidewall of the housing and the first flow directing structure.

8. The subsea unit of claim 6, further comprising a first heat sink arranged in thermal conductive connection with the first heat generating component, wherein the first heat sink is arranged between the sidewall of the housing and the first flow directing structure.

9. The subsea unit of claim 8, wherein the first heat generating component is arranged on the inner side of the first flow directing structure, the inner side of the first flow directing structure being the side of the first flow directing structure that faces the centre of the housing.

10. The subsea unit of claim 6, further comprising a second flow directing structure arranged along a top wall of the housing for guiding the dielectric liquid horizontally.

11. The subsea unit of claim 10, wherein the first flow directing structure is connected to the second flow directing structure.

12. The subsea unit of claim 10 comprising a second heat sink arranged in thermal conductive connection with the top wall of the housing.

13. The subsea unit of claim 10 comprising a flow restriction arrangement for preventing dielectric liquid guided by the second flow directing structure from flowing backwards and mixing with dielectric liquid guided by the first flow directing structure.

14. A subsea unit arrangement comprising: a main subsea unit, configured in accordance with claim 1; and
    a subordinate subsea unit arranged inside said main subsea unit; wherein said subordinate subsea unit comprises:
    a housing containing a dielectric liquid;
    a first heat generating component; and a second heat generating component, wherein the first heat generating component is arranged in thermal conductive connection with the housing, wherein the second heat generating component is arranged at a distance from a lateral side wall of the housing, wherein the first heat generating component is arranged in thermal conductive connection with the side wall of the housing.

15. A method of cooling heat generating components contained in a housing of a subsea unit comprising the steps of:
    providing a housing; arranging a first heat generating component in thermal conductive connection with a lateral side wall of the housing;
    arranging a second heat generating component at a distance from the lateral side wall of the housing;
    filling the housing with a dielectric liquid so that the heat generating components are immersed in the dielectric liquid;
    arranging the subsea unit under the sea water surface, preferably on the seabed, so that the housing is cooled by the sea water; and
    supplying electric power to the heat generating components so that the first heat generating component heats up the dielectric liquid and thus a convective flow of the dielectric liquid is created within the housing, cooling also the second heat generating component.

16. The subsea unit of claim 2, wherein the first heat generating component has a higher heat loss than the second heat generating component.

17. The subsea unit of claim 2 comprising a first heat sink arranged in thermal conductive connection with the first heat generating component.

18. The subsea unit of claim 3 comprising a first heat sink arranged in thermal conductive connection with the first heat generating component.

19. The subsea unit of claim 1, wherein a side wall insulator is arranged to insulate said side wall apart from where the first heat generating component is arranged in thermal conductive connection with the lateral side wall.

20. The subsea unit arrangement of claim 14, wherein a side wall insulator is arranged to insulate said side wall apart from where the first heat generating component is arranged in thermal conductive connection with the side wall.

\* \* \* \* \*